(12) United States Patent
Wang et al.

(10) Patent No.: US 7,808,110 B2
(45) Date of Patent: Oct. 5, 2010

(54) SEMICONDUCTOR PACKAGE SUBSTRATE

(75) Inventors: Yu-Po Wang, Taichung (TW);
Chien-Ping Huang, Taichung (TW);
Wei-Chun Lin, Taichung (TW); Wen Cheng Lee, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 493 days.

(21) Appl. No.: 12/011,906

(22) Filed: Jan. 30, 2008

(65) Prior Publication Data

US 2008/0185726 A1 Aug. 7, 2008

(30) Foreign Application Priority Data

Feb. 1, 2007 (TW) .............. 96103646 A

(51) Int. Cl.
*H01L 29/40* (2006.01)

(52) U.S. Cl. ............ 257/773; 438/612; 438/614; 438/617; 438/599; 257/4; 257/778; 257/E23.004; 257/786; 257/459; 257/697; 257/E21.058; 257/E23.015; 257/706; 257/707

(58) Field of Classification Search ........... 438/617, 438/614, 612, 599; 257/4, 738, 773, E23.004, 257/786, 459, 697, E21.058, E23.015, 706–707
See application file for complete search history.

(56) References Cited

U.S. PATENT DOCUMENTS

| | | | | |
|---|---|---|---|---|
| 3,519,890 A | * | 7/1970 | Ashby | 361/776 |
| 3,795,845 A | * | 3/1974 | Cass et al. | 257/786 |
| 4,893,172 A | * | 1/1990 | Matsumoto et al. | 174/254 |
| 4,959,706 A | * | 9/1990 | Cusack et al. | 257/786 |
| 5,091,825 A | * | 2/1992 | Hill et al. | 361/772 |
| 5,185,652 A | * | 2/1993 | Waldron et al. | 257/758 |
| 5,300,815 A | * | 4/1994 | Rostoker | 257/786 |
| 5,319,224 A | * | 6/1994 | Sakashita et al. | 257/203 |
| 5,444,303 A | | 8/1995 | Greenwood et al. | |
| 5,465,217 A | * | 11/1995 | Yip et al. | 716/21 |
| 5,491,303 A | * | 2/1996 | Weiss | 174/262 |
| 5,498,767 A | * | 3/1996 | Huddleston et al. | 716/12 |
| 5,628,919 A | * | 5/1997 | Tomura et al. | 216/18 |
| 5,666,009 A | * | 9/1997 | Kumano et al. | 257/784 |
| 5,898,213 A | | 4/1999 | Torres et al. | |
| 5,962,926 A | * | 10/1999 | Torres et al. | 257/786 |
| 6,008,532 A | * | 12/1999 | Carichner | 257/691 |
| 6,222,738 B1 | * | 4/2001 | Maeno et al. | 361/772 |
| 6,259,038 B1 | * | 7/2001 | Sakaguchi et al. | 174/261 |

(Continued)

*Primary Examiner*—Fernando L Toledo
*Assistant Examiner*—Ankush k Singal
(74) *Attorney, Agent, or Firm*—Peter F. Corless; Steven M. Jensen; Edwards Angell Palmer & Dodge LLP

(57) ABSTRACT

A semiconductor package substrate proposed by the invention includes a base body and a plurality of finger pads disposed on surface of the base body, wherein the finger pads are arranged in such a way that an angle is formed between connecting line of centers of two adjacent finger pads and the direction in which the finger pads are arranged. The finger pads are waterdrop shaped finger pads with arc ends and angle ends alternately disposed on surface of the substrate, alternately disposed waterdrop shaped finger pads and arc shaped finger pads, or alternately disposed arc shaped finger pads at a predetermined spacing. According to the present invention, distance between adjacent finger pads is reduced and problem of short circuit as a result of erroneous contact between bonding wire and adjacent finger pad is prevented.

16 Claims, 3 Drawing Sheets

U.S. PATENT DOCUMENTS

| | | | |
|---|---|---|---|
| 6,269,327 B1* | 7/2001 | Bednar et al. | 703/8 |
| 6,310,398 B1* | 10/2001 | Katz | 257/773 |
| 6,361,959 B1* | 3/2002 | Beroz et al. | 435/14 |
| 6,376,913 B1* | 4/2002 | Buck | 257/775 |
| 6,465,891 B2 | 10/2002 | Wang et al. | |
| 6,531,762 B1* | 3/2003 | Liao et al. | 257/666 |
| 6,590,296 B2* | 7/2003 | Nakamura | 257/786 |
| 6,635,553 B1* | 10/2003 | DiStefano et al. | 438/455 |
| 6,700,208 B1* | 3/2004 | Yoneda | 257/779 |
| 6,713,881 B2* | 3/2004 | Umehara et al. | 257/786 |
| 6,734,570 B1* | 5/2004 | Archer | 257/786 |
| 6,884,711 B2* | 4/2005 | Vonstaudt | 438/617 |
| 7,064,450 B1* | 6/2006 | Eghan et al. | 257/786 |
| 7,161,251 B2* | 1/2007 | Vonstaudt | 257/786 |
| 7,656,019 B2* | 2/2010 | Tsutsumi et al. | 257/690 |
| 2003/0011038 A1* | 1/2003 | Kida | 257/459 |
| 2003/0218245 A1* | 11/2003 | Matsuzawa et al. | 257/734 |
| 2004/0022040 A1* | 2/2004 | Sitaraman et al. | 361/772 |
| 2005/0012222 A1* | 1/2005 | Huang | 257/773 |
| 2005/0194538 A1* | 9/2005 | Kurz | 250/338.1 |

* cited by examiner

SEMICONDUCTOR PACKAGE SUBSTRATE

BACKGROUND OF THE INVENTION

1. Field of the Invention

The present invention relates generally to a carrier board, and more particularly to a semiconductor package substrate.

2. Description of Related Art

In order to meet ever-increasing demands for advanced electronic products with multi-functions, a ball grid array (BGA) type packaging technique is frequently employed and becomes very popular as such packaging technique is capable of providing a sufficient amount of input/out (I/O) connections for connecting high-density electronic components and electronic circuits.

Along with continuous improvements in semiconductor packaging technology, the amount and the density of I/O connections are drastically increased in a BGA package. In view of this, an increasing amount of finger pads corresponding to the amount of I/O connections must be formed on a substrate to act as external electrical connecting terminals of a semiconductor chip, so as to allow the semiconductor chip to be electrically connected external circuits through the finger pads by means of wire bonding.

A known layout of finger pads on a substrate, which is similar to what has been disclosed by U.S. Pat. Nos. 6,465,891 and 6,531,762, has a plurality of finger pads disposed around the periphery of a semiconductor chip at equal intervals, wherein a plurality of bonding wires are employed to respectively electrically connect bonding pads of the semiconductor chip to the finger pads of the substrate, so as to form external electrical connections of the chip.

The amount of I/O connections may be increased to improve electrical functionality of the semiconductor package, wherein the amount of the bonding pad of the chip and the finger pads of the substrate may be increased accordingly. However, in order to achieve such arrangement, pitches between the finger pads have to be reduced to a certain level. Moreover, the finger pads shall be disposed in position near the chip to shorten the length of the bonding wires, in order to improve electrical functionality and reduce production cost.

Referring to FIG. 1, a prior-art layout of finger pads on a substrate, which can shorten the length of bonding wires, is disclosed by U.S. Pat. No. 5,898,213. In the prior art, a plurality of finger pads 111 and its adjacent finger pads 112 are staggered around the periphery of a chip 12, wherein, hereinafter, the foregoing finger pads that are closer to the center of the chip 12 are referred as the first finger pads 111 and the ones that are further from the center of the chip 12 are referred as the second finger pads 112. Moreover, a plurality of bonding wires 13 are employed for electrically connecting bonding pads 122 on the chip 12 to the finger pads 111, 112 on the substrate. As the first finger pads 111 and the second finger pads 112 are disposed in a staggered pattern, the pitch distance Q between the finger pads 111, 112 is thus reduced, thereby reducing the length and the wire bonding distance of the bonding wires.

The foregoing technique may reduce the patch distance between the first finger pads 111 and the second finger pads 112. In practical implementation, a bonder is employed for connecting the chip 12 to the first finger pads 111 and then to the second finger pads 112 via bonding wires 13. However, because the size, shape and location of the second finger pads 112 are very close to that of lead traces of the first finger pads 111, the bonder can hardly distinguish the second finger pads 112 from the lead traces of the first finger pads 111, thereby frequently, mistakenly recognizing lead traces formed at the rear portions of the first finger pads 111 as the second finger pads 112 and erroneously bonding the bonding wires to the lead traces of the first finger pads 111 rather than the second finger pads 112 (such incorrect bonding is shown in FIG. 1 by a dotted line). Moreover, such wire bonding error may lead to short circuit and even jeopardize the entire semiconductor package.

Furthermore, referring to FIG. 2, another known layout of finger pads on a substrate is disclosed in U.S. Pat. No. 5,444,303, which is capable of reducing the length of bonding wires. In such prior-art layout, a plurality of finger pads 21 are disposed in rows, wherein the finger pads 21 are trapezium-shaped or reverse trapezium-shaped, with one longer side thereof parallel to an one shorter side thereof. Moreover, the longer side of one of the finger pads 21 may be closer to the chip 22, whereas the longer side of the one of the adjacent finger pads 21 may have the longer side further from the chip 22. In addition, a plurality of bonding wires 23 are employed for electrically connecting bonding pads 222 on the chip 22 to the finger pads 21 on the substrate.

Similarly, due to the trapezium-shaped finger pads, although the wire bonding distance is reduced in aforesaid technique, when bonding wire is bonded to short side of a finger pad close to the chip, the bonding wire is easy to sag down and contact adjacent finger pad, thus resulting in electrical short circuit, as indicated by a label S in FIG. 2. Particularly for bonding wires disposed at farther outer side of the substrate, the longer and the higher the bonding wires, the easier the bonding wires sag down and contact adjacent finger pads. Hence, the reliability of the process is adversely affected.

Therefore, there is a need to prevent wire bonding error and electrical short circuit problem caused by faulty contact of bonding wire with adjacent finger pad while reducing the wire bonding distance.

SUMMARY OF THE INVENTION

According to the above drawbacks, an objective of the present invention is to provide a semiconductor package substrate for efficiently reducing pitches between finger pads.

Another objective of the present invention is to provide a semiconductor package substrate for preventing wire bonding errors.

A further objective of the present invention is to provide a semiconductor package substrate for preventing short circuit problem caused by erroneous contact between bonding wires and adjacent finger pads.

In order to attain the above and other objectives, the present invention discloses a semiconductor package substrate, which comprises: a base body; and a plurality of finger pads alternately disposed on surface of the base body, wherein a connecting line between centers of every two adjacent finger pads forms an angle with respect to the direction in which the finger pads are arranged. The angle ranges from about 20° to about 45°, and is preferably 30°. The finger pads can be waterdrop shaped, and respectively have an arc end and an angle end opposing to the arc end. The waterdrop shaped finger pads have a diameter of d, and distance from the center of arc end to the end of angle end for a finger pad is about d. That is, length of the waterdrop shaped finger pad is d+d/2, i.e. 3d/2. Distance between centers of arc ends of two adjacent finger pads is d+s, wherein s is the minimum spacing distance between edges of the two adjacent finger pads on the center-to-center connecting line of the two adjacent finger pads. Further, edges of the angle ends of every two adjacent finger pads that are close to each other are in parallel.

Moreover, the finger pads can be waterdrop shaped and arc shaped. The waterdrop shaped finger pads and the arc shaped finger pads are alternately arranged. Each waterdrop shaped finger pad has an arc end and an angle end opposing to the arc end. The arc shaped finger pads are relatively positioned close to angle ends of the waterdrop shaped finger pads and arranged at a predetermined spacing. Arc ends of the waterdrop shaped finger pads have a diameter of d, and distance from the center of arc end to the end of angle end for each waterdrop shaped finger pad is d. That is, length of the waterdrop shaped finger pad is d+d/2, i.e. 3d/2. The distance between the center of arc end of a waterdrop shaped finger pad and the center of an arc shaped finger pad adjacent to the waterdrop shaped finger pad is d+s, wherein s is the minimum spacing distance between edges of the two adjacent finger pads on the connecting line between the center of arc end of the waterdrop shaped finger pad and the center of the arc shaped finger pad.

Each arc shaped finger pad has a virtual point disposed in a direction perpendicular to the direction in which the finger pads are arranged. The tangent line from the virtual point to the arc shaped finger pad is parallel to one edge of angle end of the waterdrop shaped finger pad.

Furthermore, the finger pads can be arc shaped. The arc shaped finger pads are alternately arranged on surface of the base body. The arc shaped finger pads have a diameter of d, distance between centers of two adjacent arc shaped finger pads is d+s, wherein s is the minimum spacing distance between edges of the finger pads on the connecting line between centers of the finger pads. Each arc shaped finger pad has a virtual point disposed in a direction perpendicular to the direction in which the finger pads are arranged. The virtual points of adjacent finger pads are positioned at different sides, distance from a virtual point to the center of respective finger pad is about d, and meanwhile tangent lines from virtual points to respective finger pads adjacent to each other are in parallel.

Therefore, according to the present invention, a plurality of finger pads are alternately arranged on surface of the base body of the semiconductor package substrate. The center-to-center connecting line between adjacent finger pads forms an angle with respect to the direction in which the finger pads are arranged, and the angle ranges from about 20° to about 45°, and preferably, the angle is 30°. As a result, the distance between the finger pads is reduced. In addition, erroneous contact of bonding wires with finger pads is avoided through the angle design of the present invention, thus preventing the electrical short circuit problem. Further, as the waterdrop shaped finger pads or arc shaped finger pads are quite different from shape of lead traces connected to the finger pads, it is preventable that a wire bonder wrongly recognizes that a lead trace for connecting the finger pad is another finger pad during the wire bonding process, so as to prevent errors in wire bonding process.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

Figure 1:
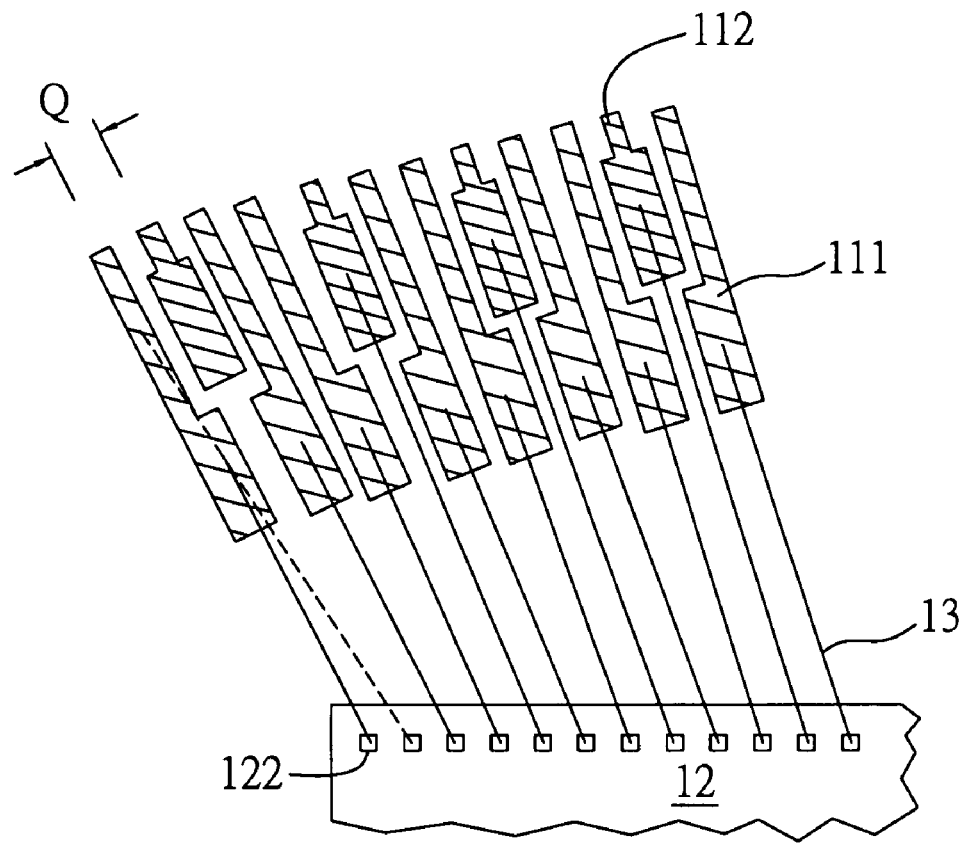
FIG. 1 is a diagram showing the layout of finger pads disclosed in U.S. Pat. No. 5,898,213.
Figure 2:
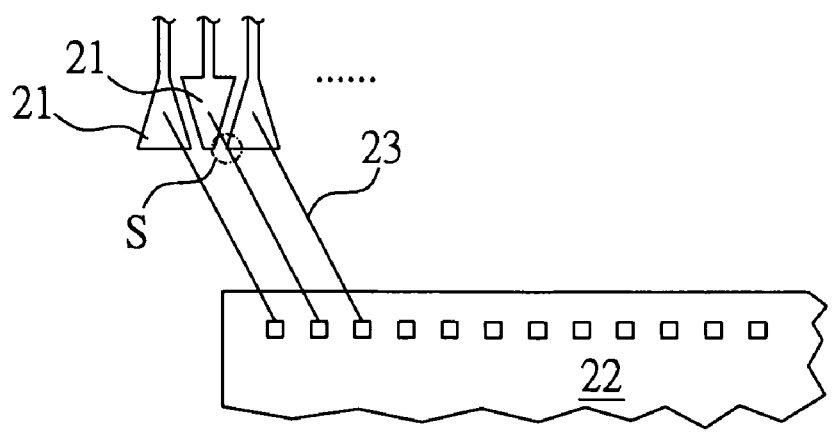
FIG. 2 is a diagram showing the layout of finger pads disclosed in U.S. Pat. No. 5,444,303.
Figure 3:
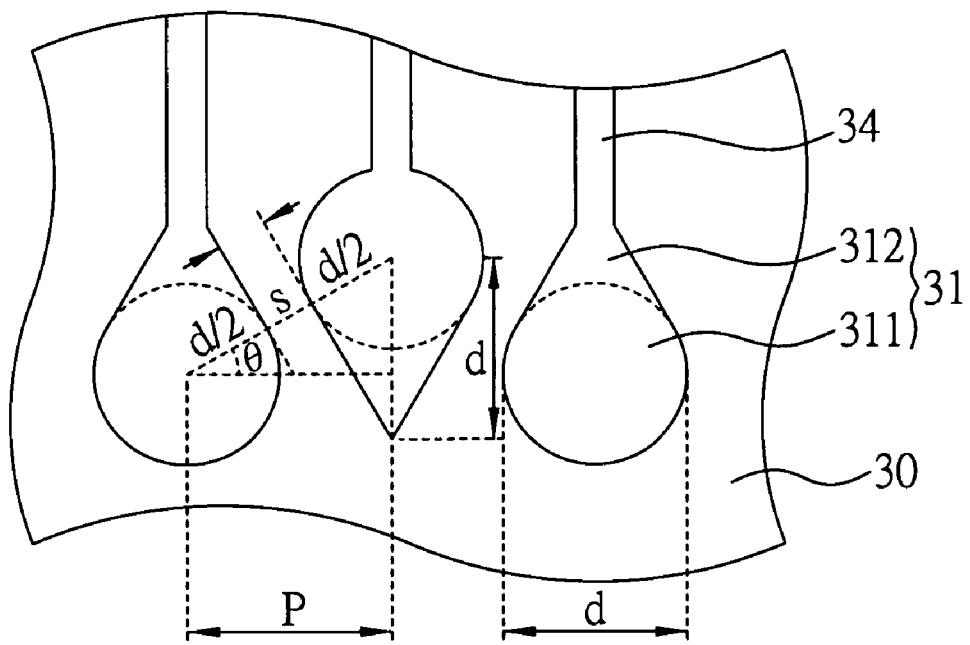
FIG. 3 is a planar diagram of a semiconductor package substrate according to the first embodiment of the present invention.

FIG. 3 is a planar diagram of a semiconductor package substrate in accordance with the present invention. The semiconductor package substrate includes a base body 30; and a plurality of finger pads 31 alternately disposed on surface of the base body 30, wherein the connecting line between centers of every two adjacent finger pads 31 forms an angle θ with respect to the direction in which the finger pads are arranged. The angle θ ranges from about 20° to about 45°, and is preferably 30°.

The base body 30 of the semiconductor package substrate can be an insulation layer or an insulation layer having stacked circuit layers. A plurality of lead traces 34 and finger pads 31 are disposed on surface of the base body 30. The finger pads 31 are waterdrop shaped and connected to the lead traces 34 through one end thereof. The insulation layer may be made of glass fiber, epoxy resin, polyimide tape, FR4 resin or BT resin.

According to the first embodiment, each finger pad 31 is waterdrop shaped and has an arc end 311 and an angle end 312 opposing to the arc end 311. The finger pads 31 are arranged on surface of the base body 30 at a predetermined spacing with the arc ends 311 and the angle ends 312 alternately disposed. The connecting line between centers of arc ends 311 of adjacent finger pads 31 forms an angle of about 30° with respect to the direction in which the finger pads 31 are arranged.

The arc end 311 of each finger pad 31 has a diameter of d. The distance from center of the arc end 311 to the end of the angle end 312 of each finger pad 31 is about d. That is, each finger pad has a length of d+d/2, i.e. 3d/2. In addition, the distance between centers of the arc ends 311 of two adjacent finger pads 31 is d+s, wherein s is the minimum spacing distance between edges of two adjacent finger pads 31 on the center-to-center connecting line of the two adjacent finger pads 31. Further, edges of angle ends 312 of every two adjacent finger pads 31 that are close to each other are in parallel.

For the conventional finger pads that are arranged in the direction identical to the center to center connecting line thereof, the minimum pitch is equal to diameter of finger pads (d=80 μm) plus the distance between the edges of the finger pads (s=25 μm), i.e. about 105 μm. In the present embodiment, since an angle of about 30° is formed by the connecting line between centers of arc ends 311 of adjacent finger pads 31 and of the direction in which the finger pads 31 are arranged, the pitch P at the direction in which the finger pads 31 are arranged is about (d+s)cos 30°=(80+25)cos 30°, i.e. 91 µm. Therefore, compared with the conventional arrangement of finger pads, the finger pitch P of the present embodiment is reduced to about 86% of its original size.

It should be noted that if the angle formed by the center-to-center line and the direction in which the finger pads are arranged is too small, the finger pitch cannot be efficiently reduced; on the other hand, if the angle becomes much larger, although the finger pitch can be reduced, bonding wires are easy to contact adjacent finger pads and the length difference between bonding wires is significantly increased. Therefore, the angle ranges from about 20° to about 45°, and is preferably 30°.

Further, the distance from the center of the arc end to the end of the angle end of a finger pad can be designed according to the requirement of bonding area. The longer the distance, the larger the bonding area becomes. In addition, when the angle between the center-to-center line and the direction in which the finger pads becomes larger, the distance from center of the arc end to end of the angle end of the finger pad can be properly reduced so as to avoid too close distance between arc end of one finger pad and angle end of an adjacent finger pad.

Figure 4:
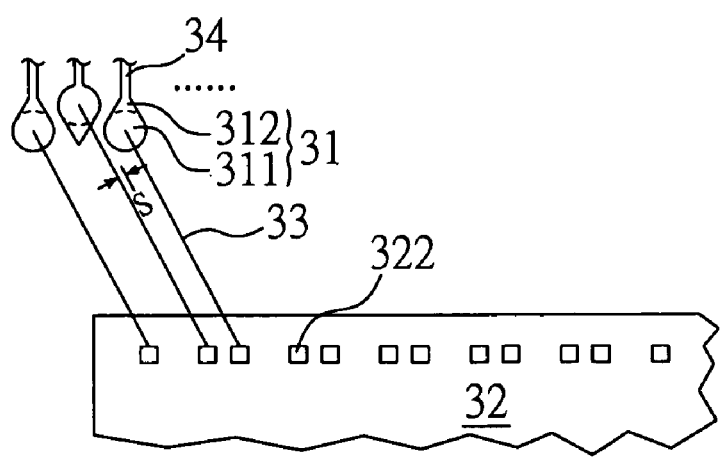
FIG. 4 is a planar diagram of a semiconductor package substrate electrically connected to a semiconductor chip according to the present invention.

Further referring to FIG. 4, at least one semiconductor chip 32 is mounted to the semiconductor package substrate of FIG. 3. The semiconductor chip 32 has a plurality of bond pads 322, and the plurality of finger pads 31 on surface of the semiconductor package substrate are disposed at periphery of the semiconductor chip 32, corresponding to the bond pads 322 and electrically connected to the bond pads 322 via a plurality of bonding wires 33.

As the arc ends 311 and the angle ends 312 of the waterdrop shaped finger pads 31 are alternately arranged, and the center-to-center line of arc ends 311 of adjacent finger pads 31 forms an angle with respect to the direction in which the finger pads 31 are arranged, the distance between the finger pads 31 along the arrangement direction of the finger pads is reduced. Further, the bonding wires 33 connected to the finger pads 31 and the semiconductor chip 32 keep at least a distance of S from adjacent finger pads 31, thereby preventing erroneous contact of the bonding wires 33 with adjacent finger pads 31 and accordingly eliminating electrical short circuit.

In addition, as the waterdrop shape of the finger pads 31 is quite different from shape of the lead traces 34, and a certain distance is kept therebetween, it is preventable that the conventional wire bonder wrongly recognizes a lead trace connected to a finger pad as another finger pad and thus causes error bonding.

Second Embodiment

Figure 5:
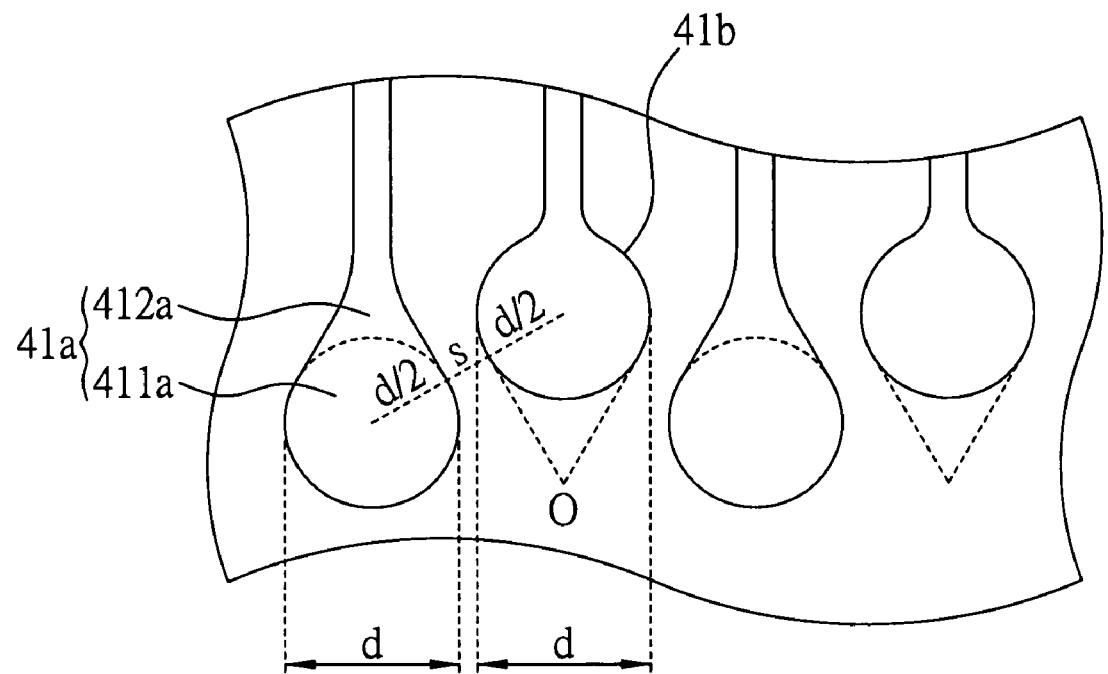
FIG. 5 is a planar diagram of a semiconductor package substrate according to the second embodiment of the present invention.

FIG. 5 is a planar diagram of a semiconductor package substrate according to the second embodiment of the present invention.

Referring to FIG. 5, waterdrop shaped finger pads 41a and arc shaped finger pads 41b are alternately arranged on the semiconductor package substrate. Each waterdrop shaped finger pad 41a has an arc end 411a and an angle end 412a opposing to the arc end 411a. The connecting line between the center of an arch shaped finger pad 41b and the center of arc end 411a of a waterdrop shaped finger pad 41a adjacent to the arc shaped finger pad 41b forms an angle with respect to the arrangement direction of the finger pads, wherein the angle ranges from about 20° to about 45°, preferably, the angle is 30°. The arc shaped finger pads 41b are relatively positioned at the certain spacing and close to the angle ends 412a of the waterdrop shaped finger pads 41a.

The diameter of arc ends 411a of the waterdrop shaped finger pads 41a and the arc shaped finger pads 41b are respectively d. The distance from the center of arc end 411a to the end of angle end 412a of a waterdrop shaped finger pad 41a is about d. That is, the waterdrop shaped finger pads 41a have a length of about d+d/2, i.e. 3d/2. The center-to-center distance between adjacent waterdrop shaped finger pad 41a and arc-shaped finger pad 41b is d+s, wherein s is the minimum spacing distance between edges of two adjacent finger pads 41a and 41b on the line connecting the center of arc end 411a of the warterdrop shaped finger pad 41a and the center of the arc shaped finger pad 41b.

Each arc shaped finger pad 41b has a virtual point O disposed in a direction perpendicular to the arrangement direction of finger pads, and the virtual point O is positioned at a different side from angle ends 412a of the waterdrop shaped finger pads 41a. The tangent line from a virtual point O to corresponding arc shaped finger pad 41b is in parallel with one edge of the angle ends 412a of the waterdrop shaped finger pads 41a.

Third Embodiment

Figure 6:
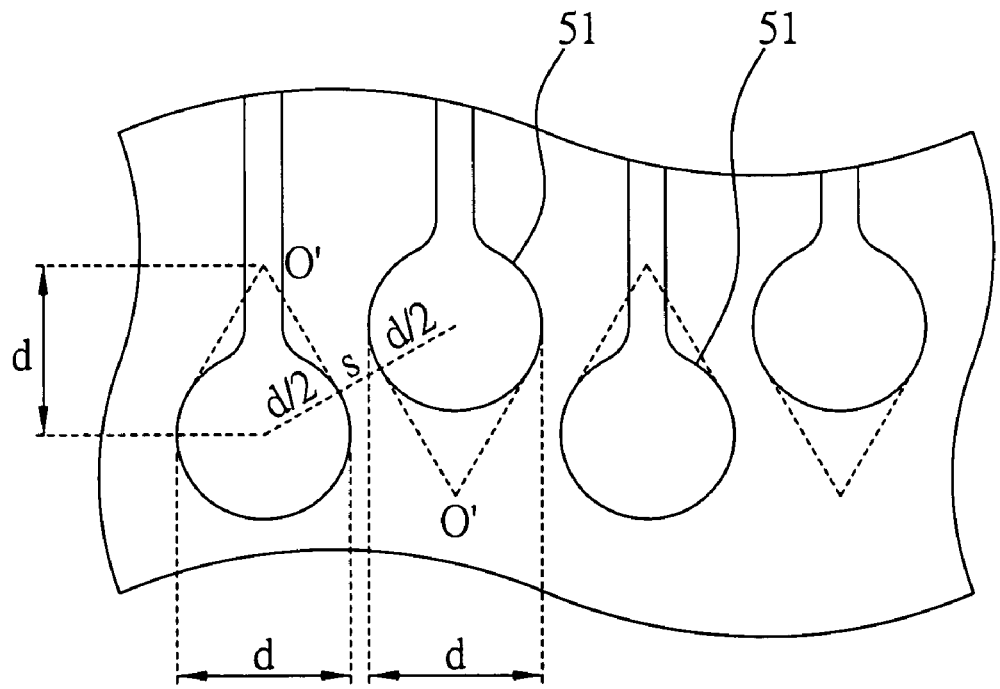
FIG. 6 is a planar diagram of a semiconductor package substrate according to the third embodiment of the present invention.

FIG. 6 is a planar diagram of a semiconductor package substrate according to the third embodiment of the present invention.

Referring to FIG. 6, a plurality of arc shaped finger pads 51 are disposed on surface of the semiconductor package substrate. The center-to-center connecting line between two adjacent arc shaped finger pads 51 forms an angle with respect to the arrangement direction of the finger pads. The angle ranges from about 20° to about 45°, and is preferably 30°. The arc shaped finger pads 51 are spaced from each other at a predetermined spacing.

The arc shaped finger pads 51 have a diameter of d, and the center-to-center distance between adjacent finger pads 51 is d+s, wherein s is the minimum spacing distance between edges of two adjacent finger pads 51 on the center-to-center connecting line between the finger pads 51. Each finger pad 51 has a virtual point O' in a direction perpendicular to the arrangement direction of the finger pads, and the distance from the point O' to the center of the finger pad 51 is d. The virtual points O' of two adjacent finger pads 51 are positioned at different sides and tangent lines from points O' to the respective finger pads 51 adjacent to each other are in parallel.

Therefore, according to the present invention, a plurality of finger pads are alternately arranged on surface of the base body of the semiconductor package substrate. The center-to-center connecting line between adjacent finger pads forms an angle with respect to the arrangement direction of the finger pads, and the angle ranges from about 20° to about 45°, and preferably, the angle is 30°. As a result, the distance between the finger pads along the arrangement direction of the finger pads is reduced. In addition, erroneous contact of bonding wires with finger pads is avoided through the angle design of the present invention, thus eliminating the electrical short circuit. Further, as the waterdrop shaped finger pads or arc shaped finger pads are quite different from the shape of lead traces connected to the finger pads, it is preventable that a wire bonder wrongly recognizes that a lead trace for connecting the finger pads is another finger pad during the wire bonding process, so as to prevent errors in wire bonding process.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package substrate, comprising:
a base body; and
a plurality of waterdrop shaped finger pads disposed on the base body, wherein each finger pad comprises an arc end and an angle end opposing to the arc end, the finger pads are arranged on the base body with arc ends and angle ends alternately arranged at a predetermined spacing, a connecting line between centers of arc ends of adjacent finger pads forms an angle with respect to a direction in which the finger pads are arranged.

2. The semiconductor package substrate of claim 1, wherein the angle ranges from about 20° to 45°.

3. The semiconductor package substrate of claim 1, wherein the base body of the semiconductor package substrate is one of an insulation layer and an insulation layer having stacked circuit layers, and a plurality of lead traces are disposed on the base body and connected to the finger pads.

4. The semiconductor package substrate of claim 1, wherein a diameter of the arc end of the waterdrop shaped finger pad is substantially equal to a distance from the center of the arc end to an end of the angle end of the finger pad, and center-to-center distance between the arc ends of adjacent finger pads is the diameter of the arc end plus a minimum spacing distance between edges of the adjacent finger pads on the connecting line.

5. The semiconductor package substrate of claim 1, wherein at least a semiconductor chip having a plurality of bond pads disposed thereon is mounted to the semiconductor package substrate, and the finger pads are correspondingly disposed at periphery of the semiconductor chip and electrically connected to the bond pads of the semiconductor chip via a plurality of bonding wires.

6. The semiconductor package substrate of claim 4, wherein edges of the angle ends of every two adjacent finger pads that are close to each other are in parallel.

7. A semiconductor package substrate, comprising:
a base body; and
a plurality of waterdrop shaped finger pads and arc shaped finger pads alternately disposed on the base body and spaced from each other at a predetermined spacing, wherein each waterdrop shaped finger pad comprises an arc end and an angle end opposing to the arc end, the arc shaped finger pads are positioned close to the angle ends of the waterdrop shaped finger pads, and a connecting line between a center of the arc end of the waterdrop shaped finger pad and a center of the arc shaped finger pad adjacent to the waterdrop shaped finger pad forms an angle with respect to a direction in which the finger pads are arranged.

8. The semiconductor package substrate of claim 7, wherein the angle ranges from about 20° to about 45°.

9. The semiconductor package substrate of claim 7, wherein the base body of the semiconductor package substrate is one of an insulation layer and an insulation layer having stacked circuit layers, and a plurality of lead traces are disposed on the base body and electrically connected to the finger pads.

10. The semiconductor package substrate of claim 7, wherein a diameter of arc end of each waterdrop shaped finger pad, a distance from the center of the arc end to an end of the angle end of a waterdrop shaped finger pad, and diameter of the arc shaped finger pad are substantially equal, a center-to-center distance between adjacent waterdrop shaped finger pad and arc shaped finger pad is the diameter of the arc end plus a minimum spacing distance between edges of adjacent waterdrop shaped finger pad and arc shaped finger pad on the connecting line.

11. The semiconductor package substrate of claim 7, wherein at least a semiconductor chip having a plurality of bond pads is mounted to the semiconductor package substrate, and the finger pads on the substrate are correspondingly disposed at periphery of the semiconductor chip and electrically connected to the bond pads via a plurality of bonding wires.

12. The semiconductor package substrate of claim 10, wherein the arc shaped finger pad has a virtual point disposed in a direction perpendicular to the direction in which the finger pads are arranged, the virtual point and the angle end of adjacent waterdrop shaped finger pad are positioned at different sides, and a tangent line from the virtual point to the arch shaped finger pad is in parallel with one edge of the angle end of the waterdrop shaped finger pad.

13. A semiconductor package substrate, comprising:
a base body; and
a plurality of arc shaped finger pads disposed on the base body and spaced apart from each other at a predetermined spacing, wherein a connecting line between centers of adjacent arc shaped finger pads forms an angle with respect to a direction in which the finger pads are arranged.

14. The semiconductor package substrate of claim 13, wherein the angle ranges from about 20° to about 45°.

15. The semiconductor package substrate of claim 13, wherein the base body of the semiconductor package substrate is one of an insulation layer and an insulation layer having stacked circuit layers, and a plurality of lead traces are disposed on the base body and connected to the finger pads.

16. The semiconductor package substrate of claim 13, wherein at least a semiconductor chip having a plurality of bond pads is mounted to the semiconductor package substrate, and the finger pads on the substrate are correspondingly disposed at periphery of the semiconductor chip and electrically connected with the bond pads via a plurality of bonding wires.

* * * * *